(12) United States Patent
Martin et al.

(10) Patent No.: US 6,340,896 B2
(45) Date of Patent: Jan. 22, 2002

(54) TEST SOCKET AND METHODS

(75) Inventors: Chris G. Martin; Manny Kin F. Ma, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/887,764

(22) Filed: Jun. 22, 2001

Related U.S. Application Data

(63) Continuation of application No. 09/472,406, filed on Dec. 27, 1999, now Pat. No. 6,262,583, which is a continuation of application No. 09/007,947, filed on Jan. 16, 1998, now Pat. No. 6,118,291.

(51) Int. Cl.[7] .............................................. G01R 31/02
(52) U.S. Cl. ...................... 324/755; 324/754; 324/758
(58) Field of Search ................................ 324/755, 754, 324/758, 757, 761; 439/70, 71

(56) References Cited

U.S. PATENT DOCUMENTS

| | | | |
|---|---|---|---|
| 3,184,699 A | 5/1965 | Spera | |
| 3,335,227 A | 8/1967 | Damon et al. | |
| 3,354,394 A | 11/1967 | James | |
| 3,366,914 A | 1/1968 | McManus et al. | |
| 3,391,383 A | 7/1968 | Antes | |
| 3,573,617 A | 4/1971 | Randolph et al. | |
| 3,719,917 A | 3/1973 | Fischer et al. | |
| 4,426,689 A | 1/1984 | Henle et al. | |
| 4,461,525 A | 7/1984 | Griffin | |
| 5,020,998 A | 6/1991 | Ikeya et al. | |
| 5,208,529 A | 5/1993 | Tsurishima et al. | |
| 5,489,854 A | 2/1996 | Buck et al. | |
| 5,609,489 A | 3/1997 | Bickford et al. | |
| 5,628,635 A | 5/1997 | Ikeya | |
| 5,779,488 A | 7/1998 | Cluff | |

*Primary Examiner*—Safet Metjahic
*Assistant Examiner*—T. R. Sundaram
(74) *Attorney, Agent, or Firm*—TraskBritt

(57) ABSTRACT

A test socket for testing a packaged semiconductor device. The test socket includes a test substrate, at least one support member, and at least one securing member. Terminals of the test substrate are electrically connectable to a testing device. The terminals may by located within recesses that are configured to receive leads. The shapes of each support member and securing member may be complementary to the respective shapes of the bottom and top surfaces of leads extending from the packaged semiconductor device. Upon placement of a packaged semiconductor device on the test substrate, the leads are aligned with and positioned against their corresponding terminals and the support member. The securing elements are then placed against the leads to bias each lead against its corresponding terminal.

23 Claims, 8 Drawing Sheets

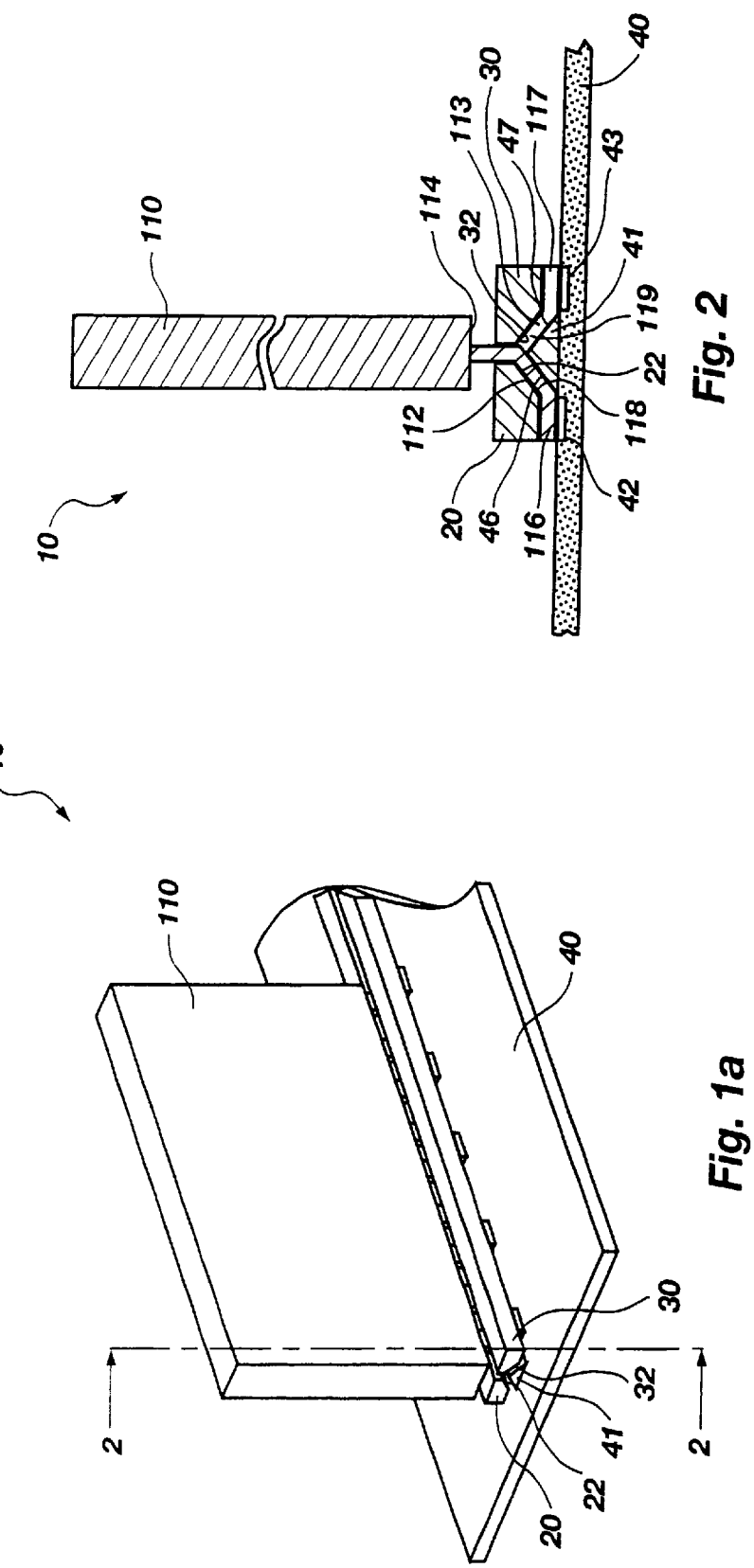

TEST SOCKET AND METHODS

CROSS REFERENCE TO RELATED APPLICATIONS

This application is a continuation of application Ser. No. 09/472,406, filed Dec. 27, 1999, now U.S. Pat. No. 6,262,583 B1, issued Jul. 17, 2001, which is a continuation of application Ser. No. 09/007,947, filed Jan. 16, 1998, now U.S. Pat. No. 6,118,291, issued Sep. 12, 2000.

FIELD OF THE INVENTION

The present invention relates to test sockets for vertical surface mount packaged semiconductor devices. In particular, the present invention relates to test sockets for vertical surface mount packaged semiconductor devices which include bent leads. More particularly, the test socket of the present invention engages and readily releases the leads of one or more vertical surface mount packages.

BACKGROUND OF RELATED ART

Semiconductor devices are routinely subjected to testing for compliance with certain electrical performance requirements and burn-in testing. Numerous test sockets have been developed for these purposes. Many such test sockets have been designed for use with a particular type of packaged semiconductor device, such as dual in-line packages (DIPs), small outline packages (SOPs), small outline J-leaded packages (SOJs), and quad flat packages (QFPs).

Many test sockets include several electrically conductive terminals for establishing an electrical connection between one or more packaged semiconductor devices and a testing device attached to the test socket. Typically, such test sockets include several small, movable parts. Exemplary devices are found in the following U.S. Pat. No. : 3,573,617 (the "'617 patent"), issued to Ellwood A. Randolph, et al. on Apr. 6, 1971; U.S. Pat. No. 4,461,525 (the "'525 patent"), issued to Wendell L. Griffin on Jul. 24, 1984; U.S. Pat. No. 5,020,998 (the "'998 patent"), issued to Kiyokazu lkeya and Masanori Yagi on Jun. 4, 1991; U.S. Pat. No. 5,208,529 (the "'529 patent"), issued to Kazuyuki Tsurishima and Teruaki Sakurada on May 4, 1993; U.S. Pat. No. 5,489,854 (the "'854 patent"), issued to Roy V. Buck and David N. Tesh on Feb. 6, 1996; U.S. Pat. No. 5,609,489 (the "'489 patent"), issued to Joel D. Bickford and Julius K. Botka on Mar. 11, 1997; and U.S. Pat. No. 5,628,635 (the "'635 patent"), issued to Kiyokazu Ikeya on May 13, 1997.

However, such test sockets are typically compatible with only a single type of packaged semiconductor device. Moreover, the parts of many test sockets in the prior art tend to wear under repeated use. Many test sockets are also problematic from the standpoint that the contacts thereof fail to accurately approximate the electrical connections that connect a packaged semiconductor device with a carrier substrate in actual use.

Many test sockets employ a cover or other device to ensure adequate electrical contact between the tested packaged semiconductor device and the test socket. The '998, '529, '854 and '489 patents each disclose test sockets which require the use of a cover or similar contact-ensuring device.

However, such devices typically exert force on the packaged semiconductor device, which could bend or otherwise damage the typically delicate leads that extend therefrom, as well as other parts of the packaged semiconductor device. Thus, the use of covers and other devices to force a packaged semiconductor device onto a test socket is somewhat undesirable. Moreover, covers and other contact-ensuring devices tend to prevent adequate heat transfer away from the tested package, and may therefore fail to recreate the conditions to which the packaged semiconductor device will be subjected in use. Further, covers and other such devices tend to be complex, increasing the cost of test sockets and the amount of time that is required to test packaged semiconductor devices.

Other test sockets clamp onto or otherwise apply force to a small portion of the leads of the tested packaged semiconductor device to establish an interference fit-type electrical contact between the leads and their corresponding terminals of the test socket. Exemplary devices are disclosed in the '617, '525 and '529 patents.

However, the use of clamps or other devices that unevenly exert force on the leads may bend or otherwise damage the typically delicate leads. Moreover, due to wear from repeated use, some test sockets fail to approximate the ohmic contact that would be made in actual use of the packaged semiconductor device. Thus, such test sockets may contribute to the generation of inaccurate test results.

What is needed is a test socket for vertical surface mount packaged semiconductor devices which approximates the actual use conditions to which the semiconductor device will be subjected, which facilitates the testing of several packaged semiconductor devices and is capable of frequently repeating the testing process on new sets of packaged semiconductor devices, and which protects and maintains the shape of the leads.

SUMMARY OF THE INVENTION

The angular compression test socket of the present invention includes a test substrate which includes a support member thereon and one or more clamps that are positionable against a substantial portion of the leads of a tested vertical surface mount packaged semiconductor device. The support member conforms to the shape of leads which extend from the packaged semiconductor device that is to be tested. Upon placement of a packaged semiconductor device on the test socket, the support member supports a bottom side of the packaged semiconductor device's leads. The clamps are shaped complementary to the opposite, upper surface of the leads.

In use of the test socket, a vertical surface mount packaged semiconductor device is oriented on the test socket such that the leads which extend from the package are aligned with their corresponding terminals on the test substrate. The clamps are then biased against the leads and exert a substantially equal amount of force along a substantial portion of the length of each lead. In combination with the opposite reactive force of the support member on the leads, the clamps establish an interference-fit type contact between each lead and its corresponding terminal on the test socket, electrically connecting the leads to their corresponding terminal.

Other advantages of the test socket of the present invention will become apparent to those of skill in the relevant art through careful consideration of the appended drawings and the ensuing description.

BRIEF DESCRIPTION OF THE SEVERAL VIEWS OF THE DRAWINGS

FIG. 1a is a frontal perspective view of a first embodiment of the angular compression test socket according to the present invention, depicting the attachment of a vertical surface mount packaged semiconductor device with two sets of bent leads thereto;

FIG. 2 is a cross-section taken along line 2—2 of FIG. 1a;

DETAILED DESCRIPTION OF THE INVENTION

Figure 1B:
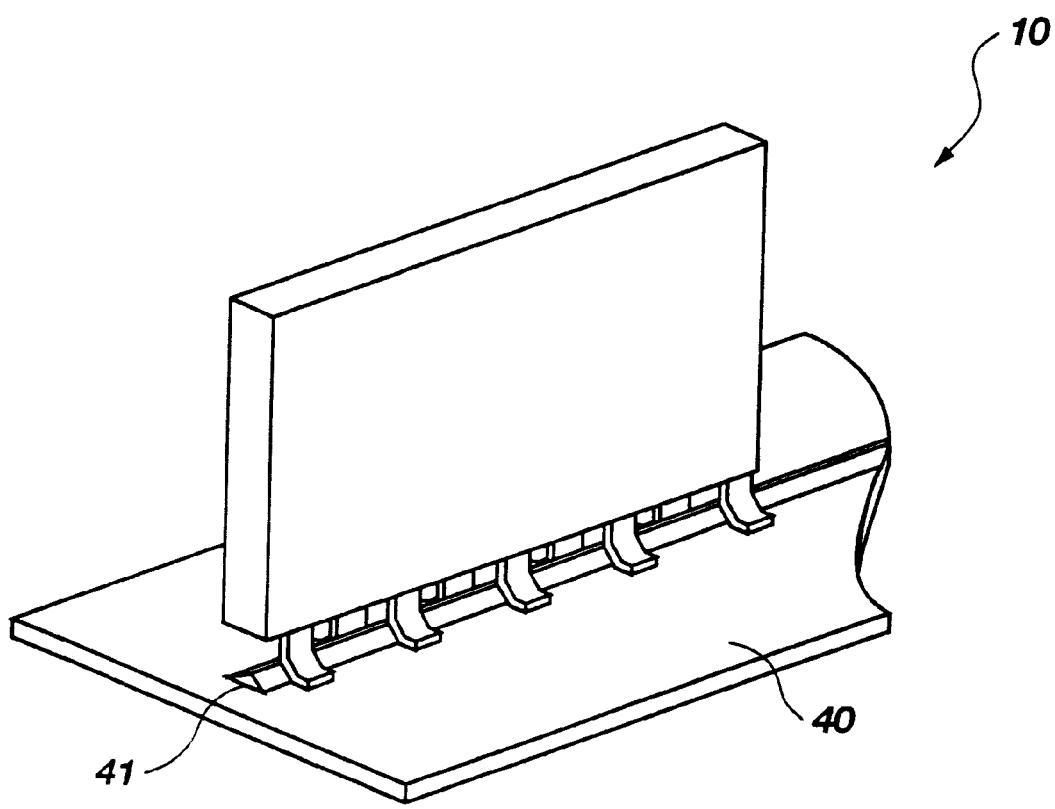
FIG. 1b is a frontal perspective view of the vertical surface mount packaged semiconductor device upon the test socket, without the clamps disposed over the vertical surface mount packaged semiconductor device's leads.

FIGS. 1a and 1b show a first embodiment of the angular compression test socket 10 of the present invention, which includes a test substrate 40, a support member 41 carried on the test substrate and extending upwardly therefrom, and clamps 20 and 30, which are attachable to the test substrate.

FIG. 2 shows a vertical surface mount packaged semiconductor device, which is also referred to as packaged semiconductor device 110, and which includes two sets of bent leads 112 and 113 extending downward from the bottom edge 114 thereof. Packaged semiconductor device 110 is oriented over test substrate 40 such that a horizontal extension 116, 117 of each of leads 112, 113, respectively, is aligned over its corresponding, electrically conductive terminal 42, 43 of the test substrate. Horizontal extensions 116 extend in a different general direction than horizontal extensions 117. The bent section 118, 119 of each of leads 112, 113 rests upon support surfaces 46, 47, respectively, of support member 41, which are shaped complementary to the lower, inner surfaces of leads 112, 113.

Figure 3A:
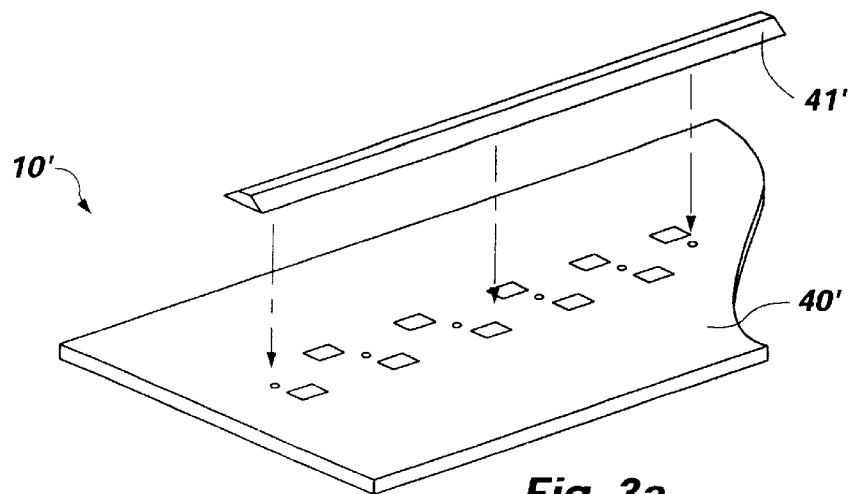
FIGS. 3a through 3c are perspective views which illustrate variations of the support member.
Figure 3B:
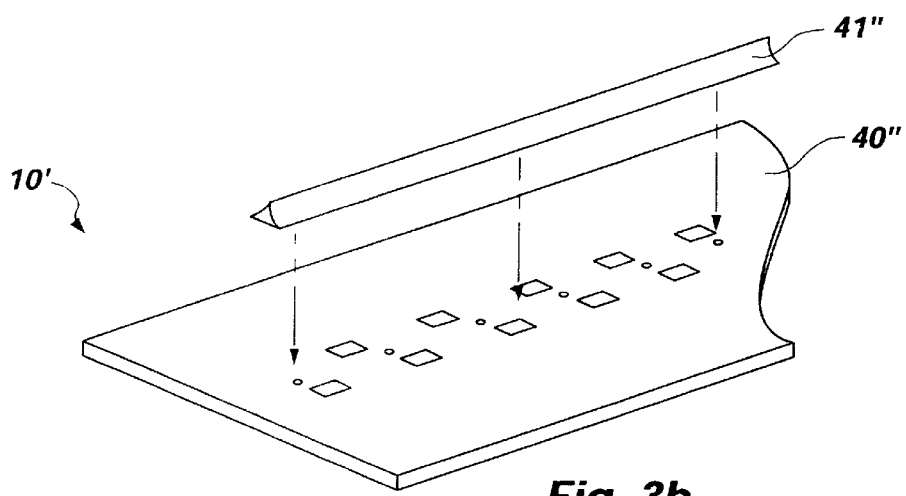
Figure 3C:
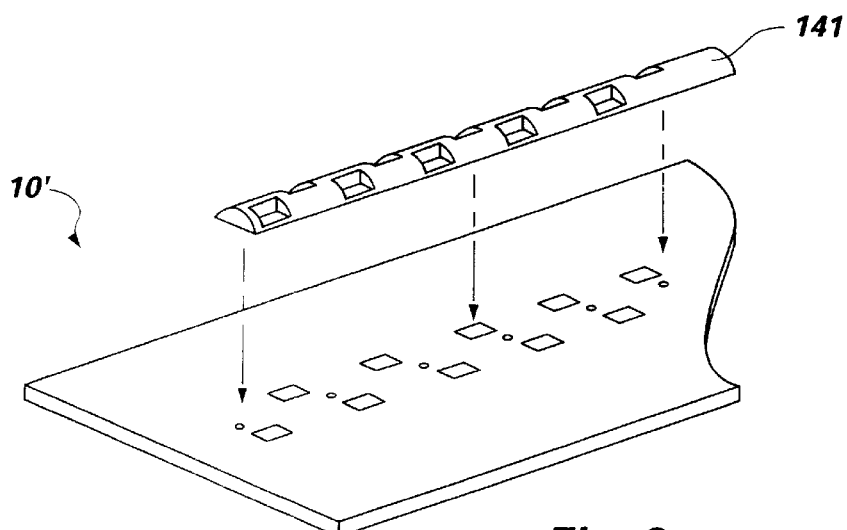

Support member 41 may be formed integrally with test substrate 40. Alternatively, as shown in FIG. 3a, support member 41' may be removable from test substrate 40', facilitating the replacement of the same with support members of different shapes and/or sizes. FIGS. 3b and 3c illustrate exemplary variations of removable support members 41" and 141, respectively, which are useful in association with test socket 10'. Such an interchangeable support member accommodates other packaged semiconductor devices having leads of different lengths and/or shapes.

Figure 4:
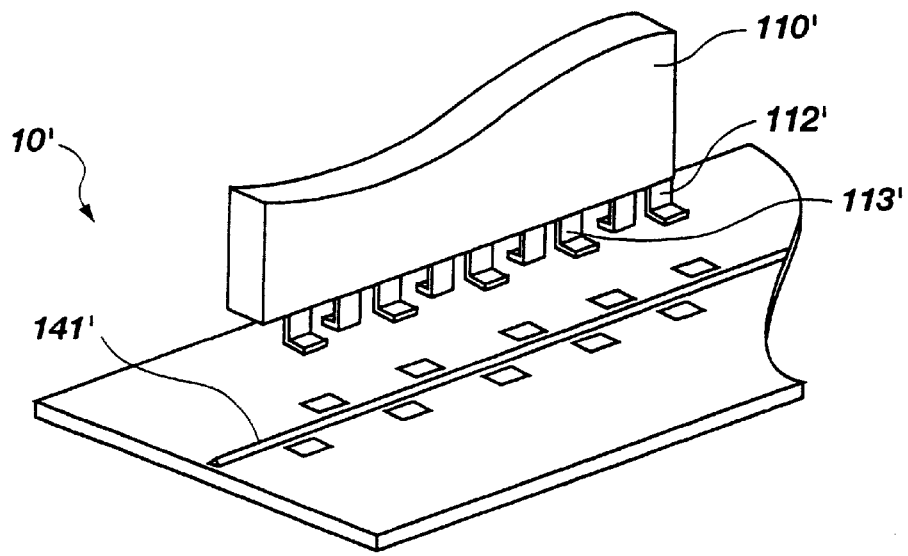
FIG. 4 is a perspective view of a second embodiment of the angular compression test socket of the present invention.

FIG. 4 illustrates yet another variation of support member 141', wherein the support member is adapted to support the substantially perpendicularly bent leads 112', 113' of a vertical surface mount packaged semiconductor device 110'.

Figure 5:
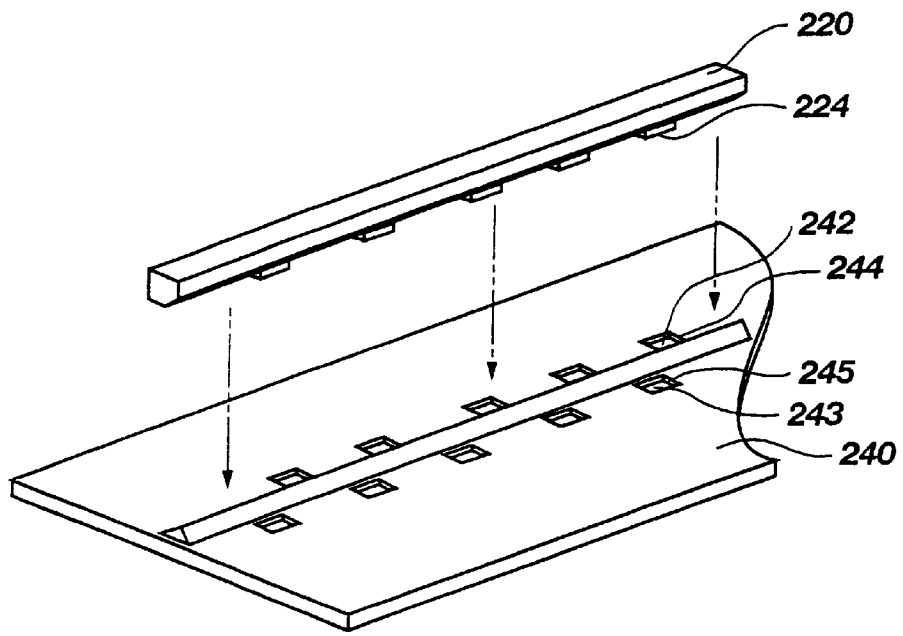
FIG. 5 is a perspective view of a third embodiment of the angular compression test socket of the present invention.

Referring now to FIG. 5, test substrate 240 may also define a lead alignment notch 244, 245 around each of terminals 242, 243, respectively. Lead alignment notch 244, 245 functions as a guide to ensure the proper alignment of leads 112, 113 (see FIG. 2) respective of their corresponding terminals 242, 243. Accordingly, the horizontal dimensions of lead alignment notch 244, 245 are at least slightly larger than those of horizontal extension 116, 117 (see FIG. 2) in order to facilitate the ready insertion of the horizontal extensions therein and ready removal of the same therefrom. The depth of lead alignment notch 244, 245 may be smaller than the thickness of horizontal extension 116, 117 in order to facilitate the biasing of the leads against their corresponding terminals 242, 243 by clamps 20, 30 (see FIG. 2). Alternatively, clamps 220, 230 may include downward extensions thereon, which are referred to as nodules 224, 234 (clamp 230 and nodules 234 are not shown). Each nodule 224, 234 is smaller than horizontal extension 116, 117 and lead alignment notch 244, 245, and, in use, biases a lead 112, 113 against its respective terminal.

Test substrate 40 and support member 41 are formed from a material which withstands the high temperatures that are typically generated by semiconductor devices during operation, resists expansion and deformation when exposed to such temperatures, has good thermal conductivity, is an electrical insulator, is formable into thin layers, and upon which metallic traces and terminals may be carried. Materials which are useful for manufacturing test substrate 40 and/or support member 41 include, without limitation, ceramics, FR4 board, BT resins, borophosphosilicate glass (BPSG), phosphosilicate glass (PSG) and borosilicate glass (BSG). Test substrate 40 and support member 41 may be manufactured by known methods for fabricating carrier substrates.

Test substrate 40 may be adapted to accommodate one or several packaged semiconductor devices 110. Preferably, test substrate 40 accommodates several packaged semiconductor devices 110 that are disposed in an end-to-end, in-line fashion (see FIG. 9).

Referring back to FIG. 2, terminals 42, 43 are positioned upon test substrate 40 such that they align with their corresponding leads 112, 113 of the tested packaged semiconductor device(s) 110. Although illustrated as including only a single set of terminals 42, 43, test socket 10 may include several sets of terminals to accommodate various types of packaged semiconductor devices, which have leads of different sizes, different numbers of leads, different lead shapes and/or different lead patterns.

Figure 9:
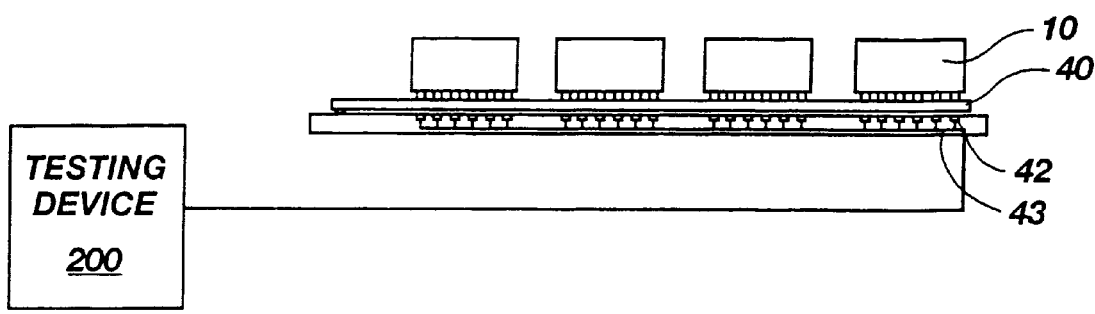
FIG. 9 is a schematic representation of a system including the test socket of the present invention.

As FIG. 9 illustrates, terminals 42, 43 are in electrical communication with a testing device 200 of the type known in the industry, such as an electrical property tester or a burn-in tester.

Referring again to FIGS. 1a and 2, a packaged semiconductor device 110 is secured to test substrate 40 with clamps 20 and 30. The lower, inner surface of each of clamps 20 and 30, which is referred to as a securing edge 22, 32, is shaped complementary to the upper, outer surface of leads 112, 113, respectively. Thus, as clamps 20, 30 are biased against leads 112, 113, they bias the leads against terminals 42, 43 and support member 41, securing packaged semiconductor device 110 to test substrate 40 and establishing an electrical communication between each of the leads and its corresponding terminal.

Figure 6:
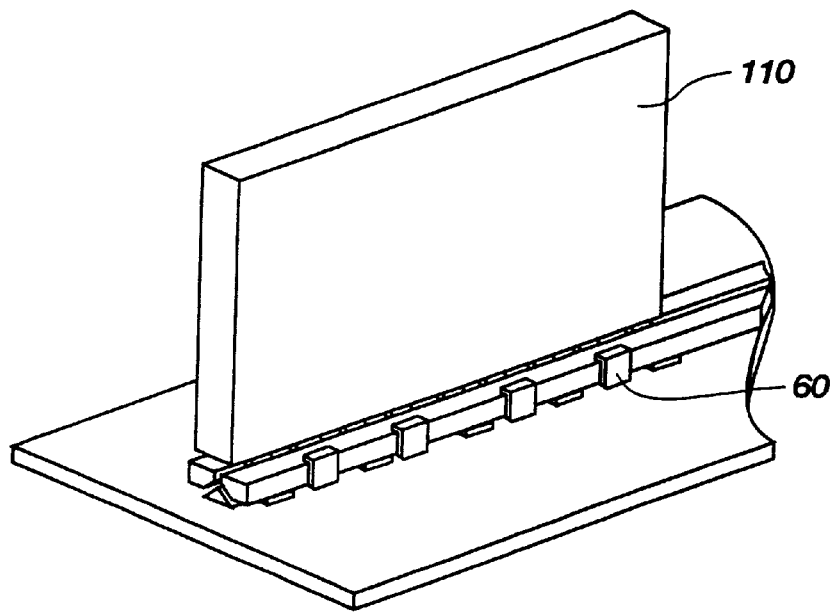
FIGS. 6 through 8 depict various biasing devices which are useful in the test socket of the present invention.
Figure 7:
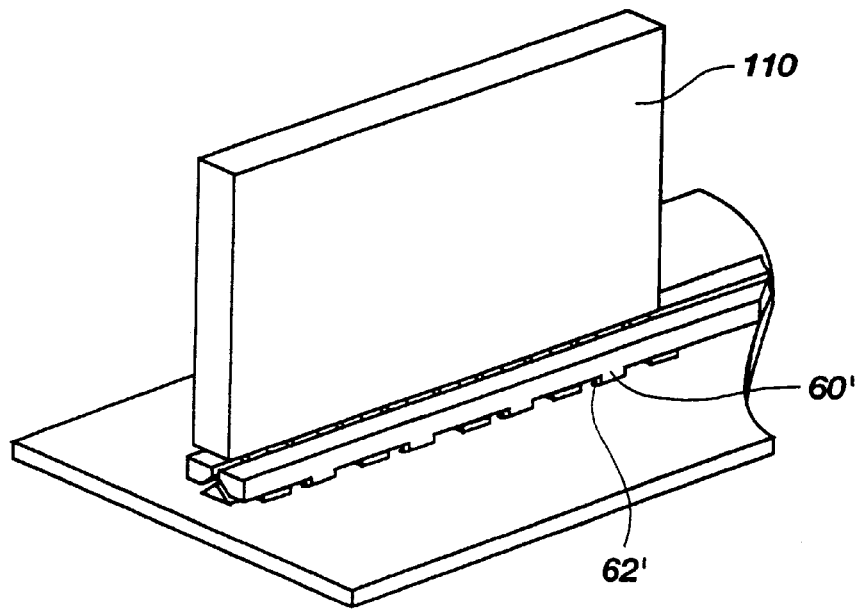
Figure 8:
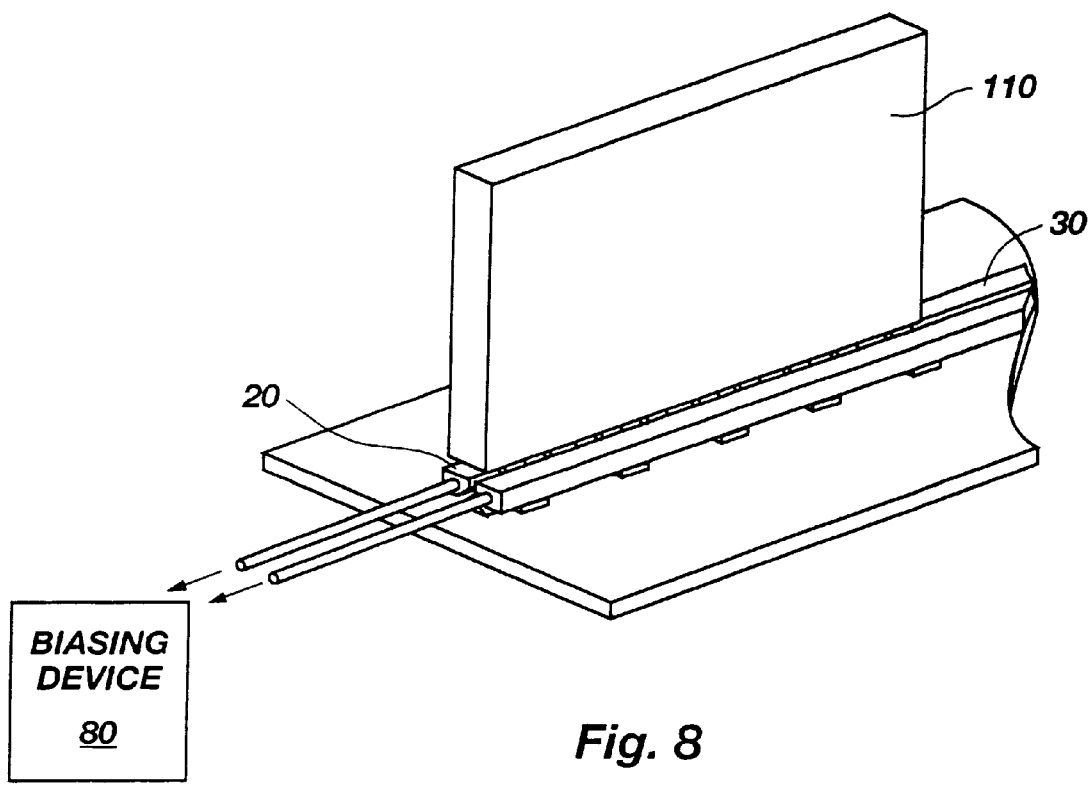

In order to place an adequate load on leads 112, 113 to establish an electrical connection with terminals 42, 43, clamps 20, 30 may engage test substrate 40. As shown in FIGS. 6 and 7, mechanisms by which clamps 20, 30 engage test substrate 40 include clamping elements 60 which extend upwardly from the test substrate and engage the clamps (see FIG. 6) or clamping elements 60' that extend downwardly from the clamps and engage the test substrate or securing receptacles 62' defined thereby (see FIG. 7). Such mechanisms are referred to as biasing devices. Alternatively, with reference to FIG. 8, a mechanically actuated biasing device 80 which positions clamps 20, 30 over leads 112, 113 and places a sustained load thereon may also be used to secure a tested packaged semiconductor device to test substrate 40 and establish an electrical connection between leads and their corresponding terminals 42, 43.

Figure 10:
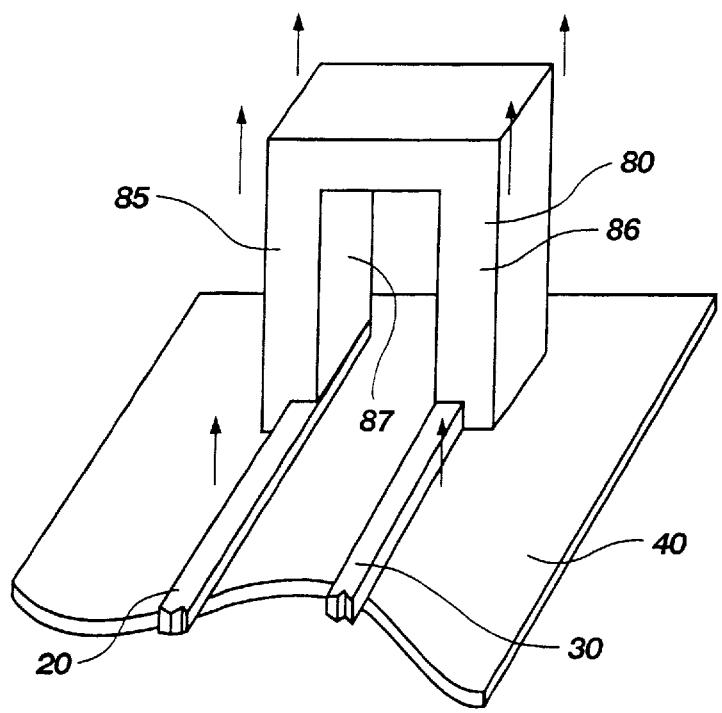
FIG. 10 is a perspective view of an embodiment of a biasing device that is useful with the test socket of the present invention.

FIG. 10 illustrates an embodiment of a biasing device 80, wherein clamps 20 and 30 are biased against the leads of a semiconductor device (not shown), which are in turn biased against the corresponding terminals of a test substrate 40, by vertical movement of the biasing device relative to the test substrate. As depicted, biasing device 80 is in a biasing position. The upward pointing arrows illustrate the direction in which biasing device 80 may be moved to place each of clamps 20 and 30 into an insertion/removal position. Biasing device 80 may also include two downwardly extending elements 85 and 86 that define a semiconductor device receptacle 87. Upon downward movement of biasing device 80 relative to test substrate 40, in order to secure a semiconductor device to the latter and test the semiconductor device, receptacle 87 may receive the semiconductor device.

Figure 11:
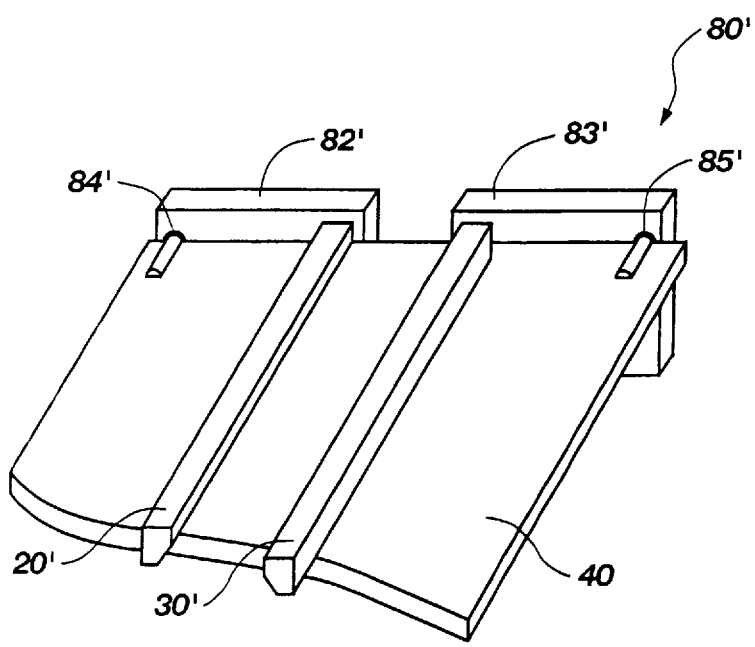
FIG. 11 is a perspective view of another embodiment of a biasing device that is useful with the test socket of the present invention, illustrating a biasing position.
Figure 12:
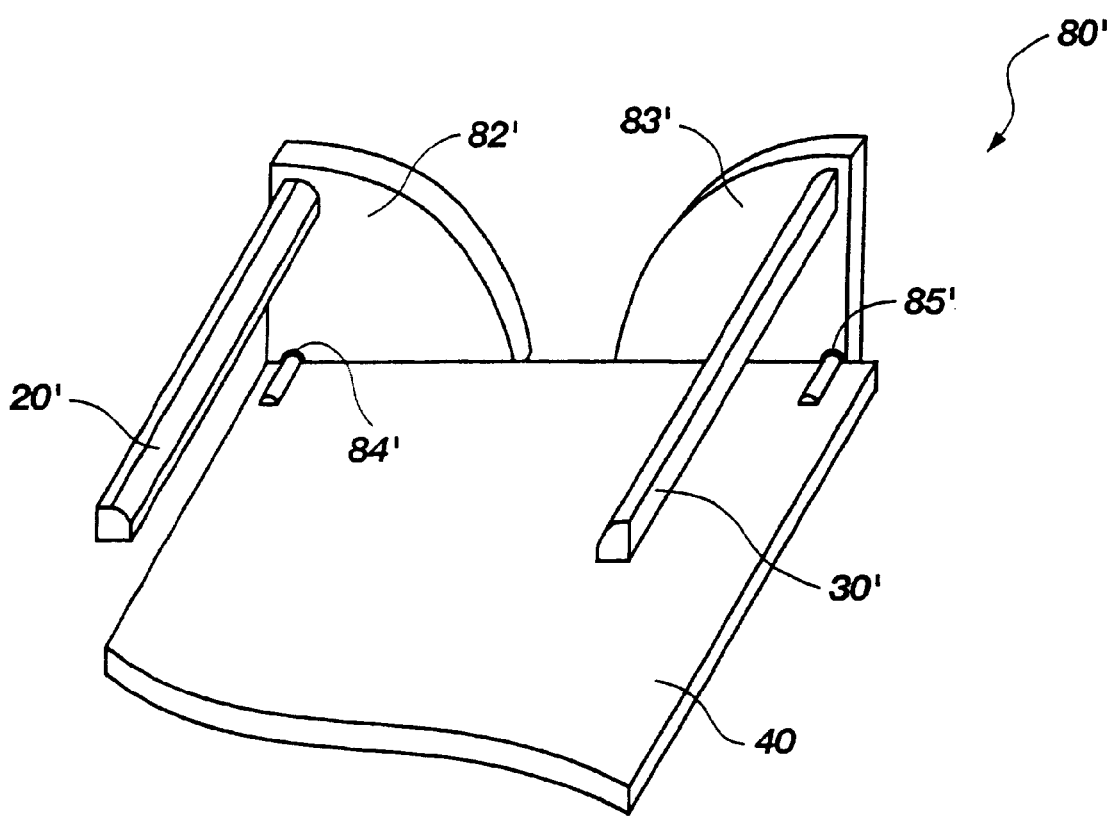
FIG. 12 is a perspective view of the biasing device of FIG. 11, illustrating an insertion/removal position.

Another embodiment of a biasing device 80', which is also referred to as an angular biasing device, is shown in FIGS. 11 and 12, wherein clamps 20' and 30' are biased against the leads of a semiconductor device (not shown), which are in turn biased against the corresponding terminals (not shown) of a test substrate 40, by pivotal movement of components 82' and 83'. As illustrated, components 82' and 83' are configured to facilitate the movement of clamps 20' and 30' between a biasing position (FIG. 11), wherein they bias the leads against their corresponding terminals, and an insertion/removal position (FIG. 12), wherein clamps 20' and 30' are moved away from the semiconductor device and the test substrate. Components 82' and 83' each include a pivot component 84' and 85', respectively, which secures and pivotally maintains the position of components 82' and 83' relative to test substrate 40.

Preferably, each of the above-described biasing devices places a load on leads 112, 113 which is directed orthogonally downward and inward relative to test substrate 40 and to the tested packaged semiconductor device 110. Thus, a substantially equalized load is placed on leads 112, 113 by clamps 20, 30.

The shapes of clamps 20, 30 and support member 41 facilitate equalization of the load placed on leads 112, 113 by clamps 20, 30. Additionally, the shapes of clamps 20, 30 and support member 41 preferably prevent damage to the leads during testing.

Clamps 20, 30 are preferably rigid in order to establish and maintain an adequate electrical connection between leads 112, 113 and their corresponding terminals 42, 43; durable so that they will withstand frequent, repeated use; electrically non-conductive so that they do not diminish the accuracy of the test data; withstand the high temperatures that are typically generated by semiconductor devices during operation; and resist expansion and deformation when exposed to such temperatures. Materials which are useful for manufacturing clamps 20, 30 include, but are not limited to, fiber reinforced plastics, ceramics, and electrical insulator-coated metals.

Referring again to FIG. 2, in use, one or more packaged semiconductor devices 110 are oriented over test substrate 40 such that leads 112, 113 align with their corresponding terminals 42, 43 and support member 41 is positioned beneath and between leads 112 and 113. Clamps 20, 30 are positioned over leads 112, 113, respectively, and biased thereagainst. Testing device 200 (see FIG. 9) then conveys electrical impulses through selected ones of terminals 42, 43 to their corresponding leads in order to test packaged semiconductor devices 110.

Advantageously, clamps 20, 30 support vertically mountable packaged semiconductor devices 110 substantially perpendicularly relative to test substrate 40, approximating the orientation of such packaged semiconductor devices during the actual use thereof. Additionally, the shapes of securing edges 22, 32 of clamps 20, 30 and support member 41, which are complementary to the shape of leads 112, 113, maintain the shape of the leads during testing. Further, clamps 20, 30 bias leads 112, 113 against their corresponding terminals 42, 43 and support member 41, providing a zero insertion force test socket. Consequently, the likelihood that test socket 10 will bend or otherwise damage leads 112, 113 is relatively small when compared with many test sockets in the prior art. Moreover, the direct electrical connection between leads 112, 113 and terminals 42, 43 better approximates an actual use electrical connection by substantially reducing the inductance and impedance created by the contacts of many prior art test sockets. Thus, test socket 10 also provides test data which more accurately represents actual in-use characteristics of the tested packaged semiconductor device 110 than many test sockets in the prior art.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention indicated by the appended claims and their equivalents. All additions, deletions and modifications which fall within the meaning and scope of the claims are embraced within their scope.

What is claimed is:

1. A test socket for use in testing a leaded semiconductor device package, comprising:
   a test substrate comprising a plurality of terminals arranged correspondingly to leads of the leaded semiconductor device package;
   a support member on said test substrate for supporting at least a portion of at least some leads of the leaded semiconductor device package; and
   a clamp for removably securing at least some leads to corresponding terminals of said test substrate without substantially deforming the leads.

2. The test socket of claim 1, wherein said support member includes a surface shaped complementary to bottom surfaces of leads to be supported thereby.

3. The test socket of claim 1, wherein said clamp is shaped complementary to top surfaces of leads to be secured thereby.

4. The test socket of claim 1, wherein said test substrate comprises at least one recess formed therein adjacent to at least one terminal of said plurality of terminals.

5. The test socket of claim 4, wherein said at least one recess is configured to at least partially receive at least one lead of the leaded semiconductor device package.

6. The test socket of claim 4, wherein said clamp comprises a plurality of downwardly extending protrusions.

7. The test socket of claim 6, wherein, upon placement of the clamp over leads of a leaded semiconductor device package positioned upon said test substrate, each of said downwardly extending protrusions is biased against at least one corresponding lead.

8. The test socket of claim 1, wherein said support member is removable from said test substrate.

9. The test socket of claim 1, further comprising a biasing component for forcing said clamp toward said support member.

10. The test socket of claim 1, wherein said support member is configured to support leads of the leaded semiconductor device package that extend in different directions from one another.

11. The test socket of claim 10, further comprising at least one additional clamp.

12. A system for testing a packaged semiconductor device, comprising:
 a testing device; and
 a test socket operatively connected to said testing device and comprising:
  a test substrate;
  terminals arranged on said test substrate;
  at least one support member on said test substrate for supporting at least portions of at least some leads of a packaged semiconductor device upon positioning thereof on said test substrate; and
  at least one clamp for reversibly securing at least some leads of the packaged semiconductor device to said terminals so as to electrically connect the packaged semiconductor device to said testing device without substantially deforming the leads.

13. The system of claim 12, wherein said at least one support member comprises at least one support surface shaped complementary to portions of leads to be placed thereagainst.

14. The system of claim 12, wherein said at least one clamp comprises a securing surface shaped complementary to top surfaces of leads against which said securing surface is to be positioned.

15. The system of claim 12, wherein said test substrate comprises at least one recessed area around at least one of said terminals.

16. The system of claim 15, wherein said at least one recessed area is configured to receive at least a portion of at least one lead.

17. The system of claim 15, wherein said at least one clamp comprises at least one protrusion in alignment with at least a portion of said at least one recessed area.

18. The system of claim 17, wherein, upon placement of said at least one clamp over at least one lead, said at least one protrusion biases against said at least one lead.

19. The system of claim 12, wherein said at least one support member and said at least one clamp are interchangeable with at least one other support member and at least one other clamp.

20. A method for securing a packaged semiconductor device to a test socket, comprising:
 orienting the packaged semiconductor device over a test substrate such that at least portions of leads of the packaged semiconductor device are supported; and
 removably securing at least some of said leads to said test socket without substantially deforming said leads.

21. The method of claim 20, wherein said removably securing comprises biasing at least portions of some leads against corresponding terminals of the test socket.

22. The method of claim 20, wherein said removably securing is effected along substantial portions of lengths of at least some leads.

23. The method of claim 20, wherein said orienting includes inserting at least portions of at least some leads into recesses formed in a surface of said test substrate.

* * * * *

UNITED STATES PATENT AND TRADEMARK OFFICE
CERTIFICATE OF CORRECTION

PATENT NO.    : 6,340,896 B2
DATED         : January 22, 2002
INVENTOR(S)   : Chris G. Martin and Manny Kin F. Ma It is certified that error appears in the above-identified patent and that said Letters Patent is hereby corrected as shown below:

<u>Title page,</u>
Item [57], ABSTRACT,
Line 5, change "by" to -- be --

Signed and Sealed this

Fourteenth Day of October, 2003

JAMES E. ROGAN
*Director of the United States Patent and Trademark Office*